United States Patent
Morton et al.

[19]

[11] Patent Number: 5,914,856
[45] Date of Patent: Jun. 22, 1999

[54] DIAPHRAGM PUMPED AIR COOLED PLANAR HEAT EXCHANGER

[75] Inventors: James R. Morton, Valencia; Robert G. Provost, West Hills, both of Calif.

[73] Assignee: Litton Systems, Inc., Woodland Hills, Calif.

[21] Appl. No.: 08/898,983

[22] Filed: Jul. 23, 1997

[51] Int. Cl.⁶ .................................................. H05K 7/20
[52] U.S. Cl. ........................... 361/690; 361/683; 361/690; 361/695; 361/704; 165/80.3; 165/165; 417/322
[58] Field of Search ................... 165/165, 80.3, 165/80.4, 104.33, 104.34, 164; 417/63, 322, 572, 48, 50; 361/683, 687, 690–697, 700–723

[56] References Cited

U.S. PATENT DOCUMENTS

| | | | |
|---|---|---|---|
| 3,833,163 | 9/1974 | Denslow et al. | 228/1 |
| 4,648,807 | 3/1987 | Tippetts et al. | 417/322 |
| 4,920,000 | 4/1990 | Nelson | 165/122 |
| 5,145,001 | 9/1992 | Valenzuela | 165/164 |
| 5,226,401 | 7/1993 | Clarke et al. | 123/571 |
| 5,353,867 | 10/1994 | Juspers | 165/165 |
| 5,525,041 | 6/1996 | Deak | 417/63 |

OTHER PUBLICATIONS

Paper entitled "DUOCEL® Aluminum Foam" (3 sheets) —Energy Research & Generation, Inc. or ERG, Inc.
Paper entitled "DUOCEL Foam Metal A New Basic Design Material for Heat Transfer Applications" (6 sheets) —Energy Research & Generation, Inc., 900 Stanford Avenue, Oakland, Ca 94608.
Paper entitled "Rainbow™ High Displacement Actuation" (5 sheets) —Aura Ceramics Inc., 5121 Winnetka Avenue North Suite 100, Minneapolis, MN 55428–4256.
Paper entitled "Thunder Pump Applications Commercial Opportunities Program" (pp. 1, 18, 19, 21, 24, 25, 38, 53) —NASA Langly Research Center, July 9–10, 1996.
Paper entitled "ACX™ Active Products PZT Quickpack™" (3 sheets) —Active Control eXperts, Inc., P/N 4009 (2/95).
Item in Sensors, Oct. 1996, p. 16, entitled "Conformance Is the New Twist in Piezoceramic Damping".
Item in Mechanical Engineering, Nov. 1995, p. 81, entitled "Rainbow wafers can move as much as .05 inch at 300 to 500 volts."

*Primary Examiner*—Leo P. Picard
*Assistant Examiner*—Michael Datskovsky
*Attorney, Agent, or Firm*—Lewis B. Sternfels

[57] ABSTRACT

A package (10, 110, 210, 310) comprises a planar heat exchanger (14, 114, 314) with an air inlet (16, 116, 316) and an air outlet (18, 118, 318) thermally coupled to an electronic module (12). A flexible diaphragm operated pump (20, 120, 220, 320) with one-way valves (132, 134; 232, 234; 332, 334) are disposed between the air inlet and the air outlet. The diaphragm is oscillable to pump air through the heat exchanger from the inlet and out through the outlet. One or more piezo-electric transducers (138, 138; 232, 238; 338) are mounted on a diaphragm (136, 236, 336) and a power source and oscillator (140) are coupled to the transducer(s) to cause the diaphragm to rapidly flex and pump the air. The heat exchanger includes an internal structure (142, 342) defining a multitude of continuous air conducting passages. The heat exchanger and the flexible diaphragm operated pump are formed as thin as possible, and the heat exchanger has an internal reticulated structure of cells connected by continuous, solid metal ligaments.

20 Claims, 3 Drawing Sheets

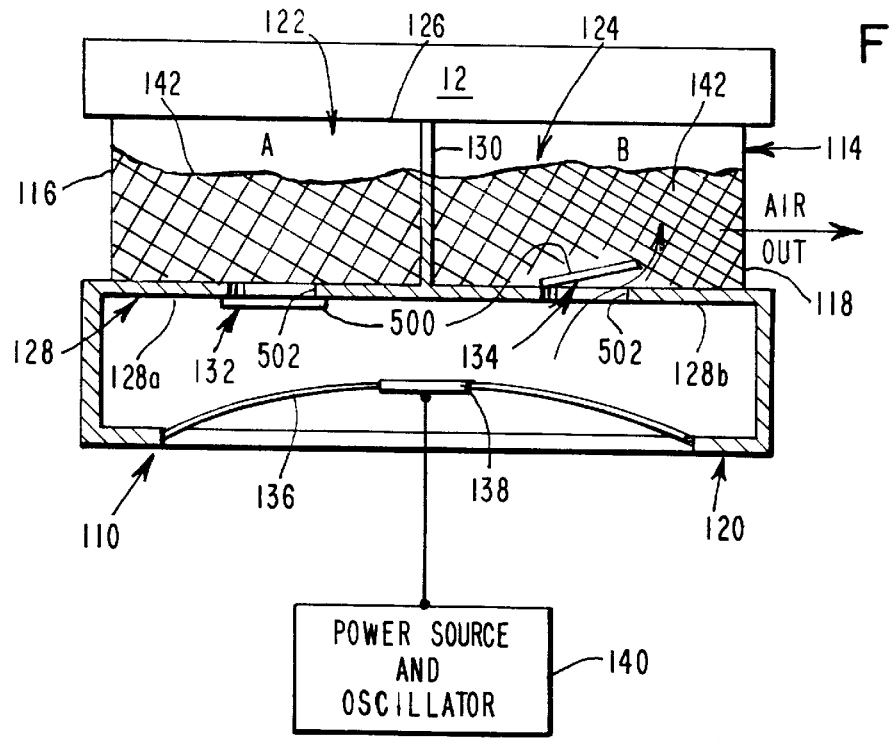
Fig. 3a.
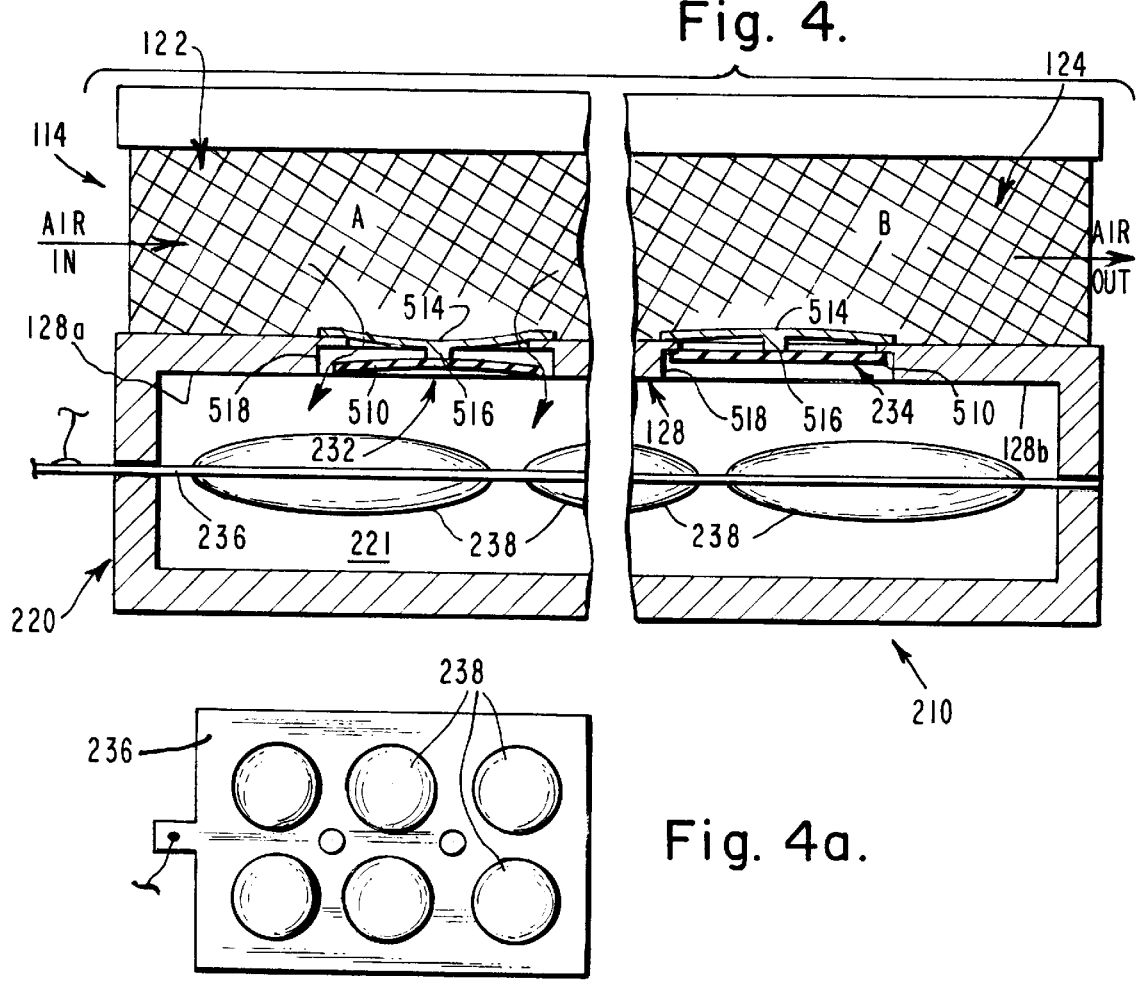
Fig. 4.
Fig. 4a.

DIAPHRAGM PUMPED AIR COOLED PLANAR HEAT EXCHANGER

CROSS-REFERENCE TO RELATED APPLICATION

Not Applicable

REFERENCE REGARDING FEDERAL SPONSORSHIP

Not Applicable

REFERENCE TO MICROFICHE APPENDIX

Not Applicable

BACKGROUND OF THE INVENTION

1. Field of the Invention

The present invention relates to cooling of electronic modules and, in particular, to cooling of such modules by a flexible diaphragm operated pump.

2. Description of Related Art and Other Considerations

Strategies for improving the cooling of electronic devices is ever ongoing, and have generated a multitude of solutions. Among these are the use of heat conducting fins and fins accompanied by fan-driven forced air systems. Because air, as the cooling fluid to remove waste heat, has a low specific heat capacity, the volume of air required increases with the amount of heat needed to be removed. Fins have a small surface area relative to the volume they occupy; thus, many are required, especially if no fan is employed. When fans are used in conjunction with fins, dirt and dust particles and friction limit the useful life of the fans. The total reliability of the cooling system is diminished as a result of wear of moving parts. In addition, fins alone or in combination with fans are bulky and hard to package.

SUMMARY OF THE INVENTION

These and other problems are successfully addressed and overcome by the present invention. A package comprises a planar heat exchanger with an air inlet and an air outlet thermally coupled to an electronic module, and a flexible diaphragm operated pump with one-way valves. The valves are disposed between the air inlet and the air outlet. The diaphragm is oscillable to pump air through the heat exchanger from the inlet and out through the outlet. One or more piezoelectric transducers are mounted on the diaphragm and a power source and oscillator are coupled to the transducer to cause the diaphragm to rapidly flex and pump the air. The heat exchanger includes an internal structure defining a multitude of continuous air conducting passages.

Preferably, the heat exchanger and the flexible diaphragm operated pump are formed as thin as possible, and the heat exchanger has an internal reticulated structure of cells connected by continuous, solid metal ligaments.

Several advantages are derived from this arrangement. The package is compact, and occupies a small volume. The heat exchanger has a large surface area relative to its volume. The number of moving parts is minimal, comprising solid state devices having inherently high reliability, and without rotating parts and bearings which are subject to wear. The size and performance of the heat exchanger can be tailored to the cooling needs and configuration of the electronics.

Other aims and advantages, as well as a more complete understanding of the present invention, will appear from the following explanation of exemplary embodiments and the accompanying drawings thereof.

BRIEF DESCRIPTION OF THE DRAWINGS

FIG. 3a is a cross-sectional view of the embodiment depicted in FIG. 2 in its air exhaust state;

FIG. 4 is a cross-sectional view of a third embodiment of the present invention;

FIG. 4a is a plan view of an assembly of piezoelectric actuators used in the third embodiment depicted in FIG. 4;

DETAILED DESCRIPTION OF THE PREFERRED EMBODIMENTS

Figure 1:
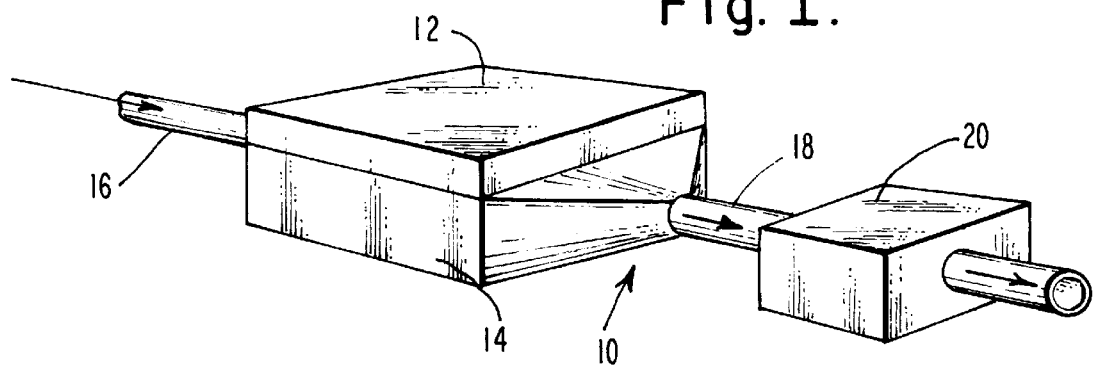
FIG. 1 is a perspective view of a preferred embodiment of the present invention.

As illustrated in FIG. 1, a package 10 comprises an electronics module, device or plurality of devices 12, and a heat exchanger 14 thermally coupled thereto in any convenient manner. Cooling air is supplied to heat exchanger 14 from an air intake 16, and removed from the heat exchanger through an air outlet. A flexible diaphragm operated pump 20 is coupled to outlet 18 to pump air through heat exchanger 14 from inlet 16 and out of outlet 18, for depositing the heated air into the environment or other heat sink. The internal construction of pump 20 is described in greater detail below with respect to any of the other embodiments. As shown, heat exchanger 14 is configured to follow the contour of electronics module, device or plurality of devices 12.

Figure 2:
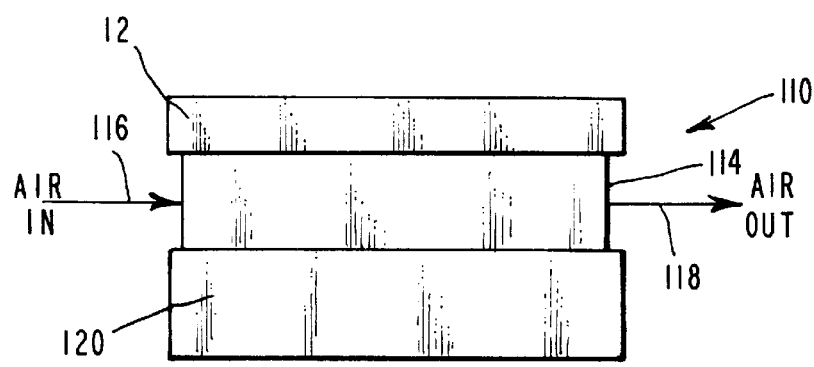
FIG. 2 is a side plan view of a second embodiment of the present invention.
Figure 3:
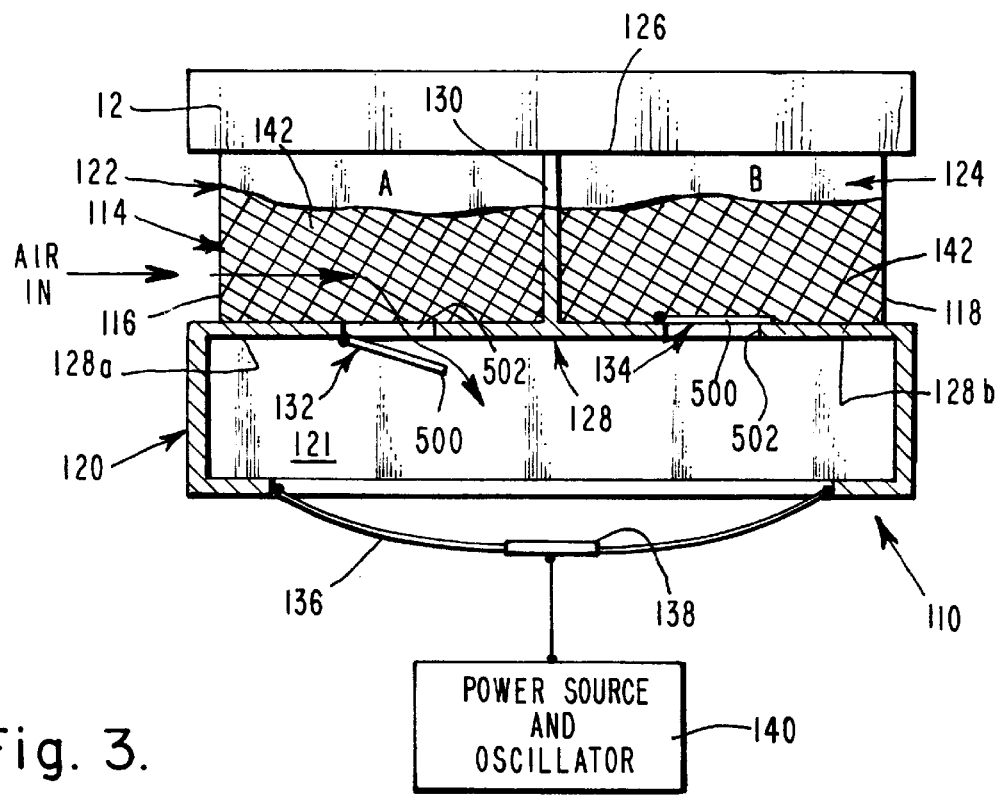
FIG. 3 is a cross-sectional view of the embodiment depicted in FIG. 2 in its air intake state.

Referring now to FIGS. 2, 3 and 3a, a package 110 comprises an arrangement which is more compact than that depicted in FIG. 1. Here, electronics 12 is thermally coupled to a heat exchanger 114, and a flexible diaphragm operated pump 120, having a cavity 121, is coupled to heat exchanger 114 to pump air through the heat exchanger from an inlet 116 and out of an outlet 118, for depositing the heated air into the environment or other heat sink.

In this embodiment, heat exchanger 114 is configured as a walled compartment having an air intake compartment 122 (also designated "A") opening at air intake 116 and an air exhaust compartment 124 (also designated "B") at air exhaust 118. A first wall 126 secures the compartments to heat generating module 12, and a second wall 128 secures the compartments to pump 120. A non-porous divider 130 is positioned between the intake and exhaust compartments, and divides second wall 128 into first and second portions 128a and 128b respectively covering intake and exhaust compartments 122 and 124. A first one-way valve 132 is positioned in first wall portion 128a and is arranged to permit air flow only to flexible diaphragm pump 120. A second one-way valve 134 is positioned in second wall portion 128b and is arranged to permit air flow only from pump 120 into exhaust compartment 124.

Flexible diaphragm operated pump 120 includes a diaphragm or film 136 of Kapton (trademark of E.I. duPont deNemours & Co.) or equivalent material and a piezo-electric transducer or actuator 138 mounted on the diaphragm film. Transducer or actuator 138 is electrically connected to a power source and oscillator 140. Diaphragm film 136 is caused to oscillate very rapidly in response to signals from the power source and oscillator from one extreme to the other as shown in FIGS. 3 and 3a.

Examples of piezo-electric transducer 138 include a Rainbows ™(trademark of Aura Ceramics Inc.) piezoelectric device comprising a reduced and internally biased oxide wafer construction, a (Thunder) piezoceramic (thin-layer composite unimorph ferroelectric driver and sensor) actuator, and an ACX™ (trademark of Active Control experts, Inc.) strain actuators that bend or extend when a voltage is applied to them.

The pumping operation is depicted in FIGS. 3 and 3a. When diaphragm film 136 is moved to its outermost position as shown in FIG. 3, air is drawn into cavity 121 of pump 120 from intake compartment 122 through one-way valve 132. One-way valves 132 and 134 are arranged in such a manner that, when valve 132 opens, valve 134 is forced closed. When diaphragm film 136 is moved to its innermost position as shown in FIG. 3a, air is forced from cavity 121 of pump 120 to exhaust compartment 124 through one-way valve 134. The organizations of one-way valves 132 and 134 are such that when valve 134 opens, valve 132 is forced closed. This very rapid flexing of diaphragm 136 causes a large volume of air to pass through heat exchanger 114 and, therefore, to provide efficient cooling of electronics module 12.

The heat exchanger includes an internal structure 142 defining a plurality of continuous air conducting passages. Structure 142 may comprise a uniformly disposed reticulated structure of cells connected by continuous, solid metal ligaments, such as DUOCEL® aluminum foam (trademark of Energy Research & Generation, Inc. or ERG, Inc). As described by the manufacturer, DUOCEL® aluminum foam is a true metal skeletal structure which is manufactured by directional solidification of metal from a super-heated liquidus state in an environment of inerts and vacuum. The resulting material has a reticulated structure of open, duodecahedronal-shaped cells connected by continuous, solid-metal ligaments.

Figure 6:
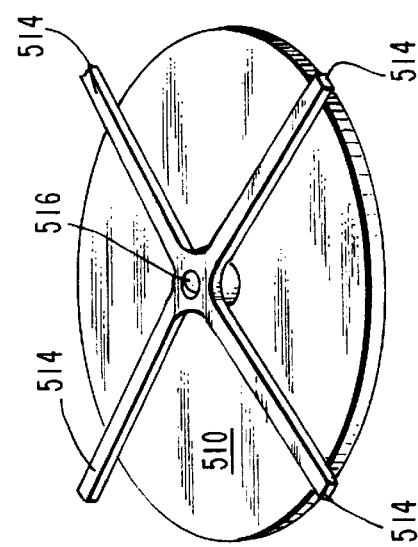
FIG. 6 is a perspective view of a valve element used in the embodiments depicted in FIGS. 4 and 5, but useful in all other embodiments.

While a single piezo-electric wafer transducer may be suitable for some applications, it may be necessary to compound the actions of a plurality of such wafers. Such a plurality of wafers is shown in FIGS. 4 and 4a as a package 210, which is similar to that illustrated in FIGS. 3 and 3a. Similar elements in both embodiments shown in FIGS. 3 and 3a and in FIGS. 4 an 4a are identified by the same numerical indicia. Here, however, a plurality of piezo-electric transducers 238, for example, twelve in number, are bonded in pairs to a diaphragm film 236 in a clamshell arrangements of pairs of transducers in a pump compartment 220 having a cavity 721. Valves 232 and 234 respectively couple cavity 221 to the air intake and exhaust compartment 122 and 124. These valves are described in greater detail below with respect to the valves of FIG. 5 and the valve elements shown in FIG. 6. Pumping of air occurs when transducers 238 collapse and expand, respectively causing valves 232 and 234 to open and close and to convey air from compartment 122 to compartment 124.

Figure 5:
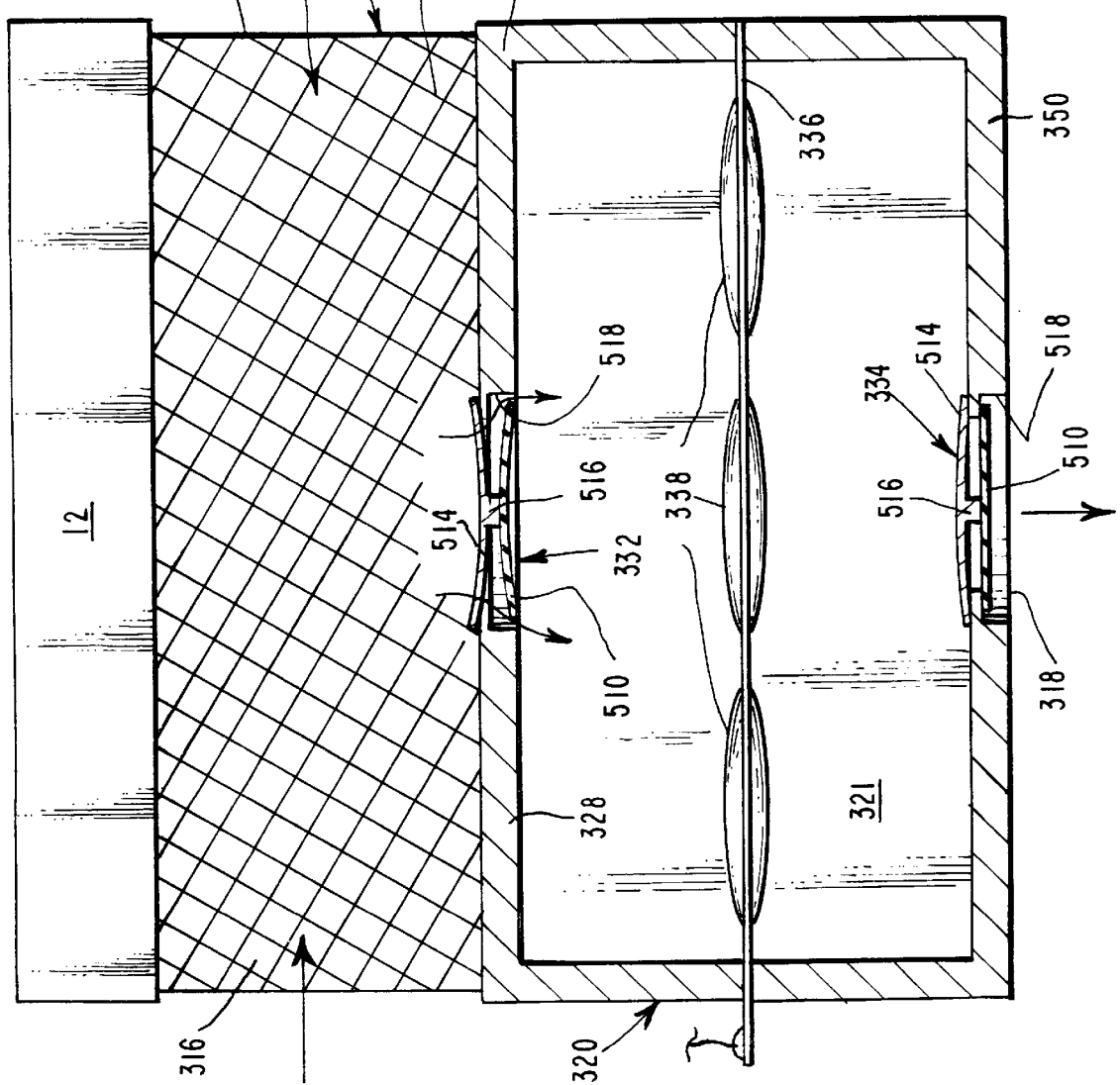
FIG. 5 is a side view of a fourth embodiment of the present invention.

A further embodiment of the present invention is depicted in FIG. 5, and comprises some elements which are like those illustrated in previous embodiments. A package 310 includes a heat exchanger 314 whose intake compartment 322 includes an internal porous structure 342. The air intake may include a single air intake 316 or a second air intake 316a. A flexible diaphragm operated pump 320, having a cavity 321, is secured to heat exchanger 314 at a connecting wall 328, and is fluidly coupled thereto by a one-way valve 332. Pump cavity 321 is coupled to the exhaust at its outlet or exhaust 318 through a one-way valve 334 supported in a cavity wall 350. Pumping is obtained by a plurality of piezo-electric transducers 338 supported on a diaphragm film 336.

The several one-way valves may be formed in any suitable manner, such a Kapton® film check valve or as disclosed in FIGS. 3 and 3a and in FIG. 4b. In FIGS. 3 and 3a, valves 132 and 134 include hinged rigid flaps 500 which extend slightly beyond the openings 502 that they cover. In FIGS. 4, 4a and 5, each valve comprises a membrane 510 (see also FIG. 6) secured to a spider spring 514 by a connecting element 516. Membrane 510 and spider spring 514 are positioned on either side of an opening 518 in wall 128a, 128b, 328 separating pump cavity 221 or 321 and compartment 220 or 320.

Operation of the FIG. 5 embodiment is described as follows. Upon contraction of transducers 338, air is drawn through valve 332 into cavity 321, valve 334 thereby being forced closed. When transducers 338 expand, the air within cavity 321 is forced out through valve 334, valve 332 in turn being forced closed.

Although the invention has been described with respect to particular embodiments thereof, it should be realized that various changes and modifications may be made therein without departing from the spirit and scope of the invention.

What is claimed is:

1. A heat exchanger for cooling electronic devices, comprising:
   a heat generating electronics module containing electronic devices;
   a heat exchange component thermally coupled to said electronics module;
   an air intake fluidly coupled to said heat exchanger component;
   an air exhaust fluidly coupled to said air intake;
   a pump including a flexible diaphragm and a mechanism coupled to and capable of oscillating said diaphragm, and arranged to pump air through said heat exchanger component from said intake to said exhaust; and
   a unidirectional air flow mechanism coupled in an air path including said air intake and exhaust, and operable in conjunction with said pump to enable unidirectional flow of the air from said intake to said exhaust.

2. A heat exchanger according to claim 1 in which said heat exchanger includes an internal structure defining a plurality of continuous air conducting passages.

3. A heat exchanger according to claim 2 in which said structure comprises a uniformly disposed reticulated structure of cells connected by continuous, solid metal ligaments.

4. A heat exchanger according to claim 1 in which said diaphragm flexing mechanism comprises at least one piezo-electric transducer mounted on said diaphragm.

5. A heat exchanger according to claim 1 in which said diaphragm flexing mechanism comprises a plurality of piezo-electric transducers spaced from one another and mounted on said diaphragm.

6. A heat exchanger according to claim 5 in which said heat exchanger includes an internal structure having a plurality of continuous air conducting passages.

7. A heat exchanger according to claim 6 in which said internal structure comprises a uniformly disposed reticulated arrangement of cells connected by continuous, solid metal ligaments.

8. A heat exchanger according to claim 6 in which said internal structure comprises a foam-like internal lattice.

9. A heat exchanger according to claim 1 in which:

said heat exchanger comprises a walled compartment secured at one wall to said heat generating module and having openings respectively coupled to said air intake and said air exhaust; and said flexible diaphragm pump is coupled to one of said openings for pumping air through said heat exchanger.

10. A heat exchanger for cooling electronic devices comprising:

a heat generating electronics module containing electronic devices;

an air intake;

an air exhaust fluidly coupled to said air intake;

a pump fluidly coupled to said air exhaust and including a flexible diaphragm and a mechanism coupled to and capable of oscillating said diaphragm, and arranged to pump air from said intake to said exhaust;

a heat exchanger component fluidly coupled to said air intake and comprising a walled compartment having opening means at said air intake, a first wall secured to said heat generating module in thermal engagement therewith, and a second wall secured to said pump;

a first one-way valve positioned in said second wall and arranged to permit air flow only to said flexible diaphragm pump; and a second one-way valve coupled to said pump and arranged to permit air flow only through said air exhaust from said pump.

11. A heat exchanger for cooling electronic devices comprising:

a heat generating electronics module containing electronic devices;

an air intake;

an air exhaust fluidly coupled to said air intake;

a pump including a flexible diaphragm and a mechanism coupled to and capable of oscillating said diaphragm, and arranged to pump air from said intake to said exhaust;

a heat exchanger component fluidly coupled to said air intake and comprising a walled compartment having an air intake compartment provided with opening means at said air intake, an air exhaust compartment provided with opening means at said air exhaust, a first wall securing said compartments to said heat generating module in thermal engagement therewith, a second wall securing said compartments to said pump, a non-porous divider positioned between said intake and exhaust compartments, and dividing said second wall into first and second portions respectively covering said intake and exhaust compartments, a first one-way valve positioned in said first wall portion and arranged to permit air flow only to said flexible diaphragm pump, and a second one-way valve positioned in said second wall portion and arranged to permit air flow only from said pump into said exhaust compartment.

12. A heat exchanger according to claim 11 in which each of said heat exchanger compartments includes an internal structure defining a plurality of continuous air conducting passages.

13. A heat exchanger according to claim 12 in which said structure comprises a uniformly disposed reticulated structure of cells connected by continuous, solid metal ligaments.

14. A heat exchanger according to claim 11 in which said diaphragm flexing mechanism comprises at least one piezo-electric transducer mounted on said diaphragm.

15. A heat exchanger according to claim 11 in which said diaphragm flexing mechanism comprises a plurality of piezo-electric transducers spaced from one another and mounted on said diaphragm.

16. A heat exchanger according to claim 15 in which each of said heat exchanger compartments includes an internal structure having a plurality of continuous air conducting passages.

17. A heat exchanger according to claim 16 in which said internal structure comprises a uniformly disposed reticulated arrangement of cells connected by continuous, solid metal ligaments.

18. A heat exchanger according to claim 16 in which said internal structure comprises a foam-like internal lattice.

19. An air cooled large surface area heat exchanger for cooling electronics, comprising:

an electronics package;

a heat exchanger component thermally coupled to said package;

an air inlet coupled to said heat exchanger component and defining a conduit for supply of cooling air thereto for removing heat generated by said electronics package;

an air outlet coupled to said heat exchanger component and defining a conduit for removal of heated air therefrom;

a flexible diaphragm operated pump disposed between said air inlet and said air outlet and oscillable to cause flow of air into said air inlet and out of said air outlet; and a unidirectional air flow mechanism coupled in an air flow path including said air inlet and said outlet, and operable in conjunction with said pump to enable unidirectional flow of the air from said inlet to said outlet.

20. A heat exchanger according to claim 19 in which said diaphragm operated pump comprises at least one piezo-electric transducer means mounted on said diaphragm and a power source and oscillator coupled to said transducer means.

* * * * *